United States Patent [19]

Nakahara et al.

[11] Patent Number: 4,682,017
[45] Date of Patent: Jul. 21, 1987

[54] SHOCK-RESISTANT INTEGRATED CIRCUIT CARD

[75] Inventors: Yoshihiko Nakahara; Masao Muramatsu; Kouichi Ueno, all of Tokyo, Japan

[73] Assignee: Kyodo Printing Co., Ltd., Japan

[21] Appl. No.: 813,036

[22] Filed: Dec. 24, 1985

[30] Foreign Application Priority Data

Dec. 29, 1984 [JP] Japan .................. 59-277734

[51] Int. Cl.⁴ .......................................... G06K 15/00
[52] U.S. Cl. ................................. 235/492; 235/487
[58] Field of Search ............................. 235/487, 492

[56] References Cited

U.S. PATENT DOCUMENTS 4,639,585 1/1987 Haghiri .......................... 235/492

Primary Examiner—Harold I. Pitts
Attorney, Agent, or Firm—Steinberg & Raskin

[57] ABSTRACT

A shock-resistant integrated circuit card arranges an integrated circuit at a marginal edge region of the card where deformation forces are minimized. A flexible circuitboard interconnects the integrated circuit with exterior terminals spaced transversely away from the integrated circuit.

8 Claims, 5 Drawing Figures

SHOCK-RESISTANT INTEGRATED CIRCUIT CARD

BACKGROUND OF THE INVENTION

1. Field of the Invention

The present invention generally relates to an integrated circuit card of the type wherein an integrated circuit is mounted within a card such as a credit/debit card, a bank card, an identification card, a medical card, etc., and, more particularly, to rendering such a card shock resistant to forces tending to deform the card.

2. Description of the Prior Art

It has been proposed in the prior art to embed an integrated circuit module or like electrical device within a conventional plastic card such as a credit/debit card, a bank card, an identification card, a medical card, and the like, to constitute an integrated circuit card or a so-called "smart" card. The integrated circuit module may be programmed or programmable, with a set of instructions for controlling the use of the card. The integrated circuit module may also have a memory in which data may be stored and from which data may be retrieved.

Although generally satisfactory for its intended purpose, such an integrated circuit card has not proven to be altogether reliable in practice. Such cards are typically carried by a user in his or her pocket and/or in a wallet or purse and, hence, are frequently subjected to various externally directed forces which act to bend, twist, push and pull the card, thereby tending to deform the card. Experience has shown that, over time, the integrated circuit module will become detached or broken loose from the card, or various electrical connections of the module will be broken, thereby rendering the card inoperative.

By way of example, reference is directed to FIGS. 4 and 5 of the patent drawings wherein a conventional integrated circuit card 100 of the prior art is shown. The card 100 is flattened and generally rectangular in shape, and has a pair of long sides 2 extending along a longitudinal direction, and a pair of short sides 3 extending along a transverse direction perpendicular to the longitudinal direction. The card 100 has rounded corners where the sides 2, 3 meet. The card 100 also has a longitudinally-extending axis of symmetry extending lengthwise of the card centrally between the short sides 3, as well as two opposite generally planar exterior major surfaces.

As best shown in FIG. 5, the card 100 includes a central body or carrier 5 having an upper overlay film 6 on an upper one of the exterior major surfaces, and another lower overlay film 7 on the lower of the exterior major surfaces of the card. A magnetic tape stripe 8 is applied on and/or embedded in the upper overlay film 6, and extends longitudinally between the short sides 3 along a marginal edge region of the card in a direction parallel to either of the long sides 2. The marginal edge region is adjacent to one of the long sides 2.

An integrated circuit module including an integrated circuit or chip 4 is embedded in the carrier 5, and has a plurality of exterior terminals 1 which are exposed through an opening formed in the upper overlay film 6 at the upper major surface of the card to the exterior thereof. The exterior terminals 1 provide access to the chip 4. The chip 4 and its exterior terminals 1 which are located directly above the chip 4 are positioned on the card generally near one longitudinal end of the card as considered with respect to the longitudinal direction and, as shown in FIG. 4, near the left end of the card. The chip 4 and its exterior terminals 1 are also positioned generally near the center of the card as considered with respect to the transverse direction and, as shown in FIG. 4, between the magnetic stripe 8 and the longitudinal axis of symmetry.

Thus, as previously discussed, when the conventional card 100 is subjected to forces tending to deform the card, particularly when such forces bend the card about a central axis, such forces are concentrated in magnitude at or near the center of the card and in the vicinity of the chip 4. Thus, the forces applied at the chip and around its perimeter are high in magnitude and tend to separate the chip, which has a relatively stiff, rigid characteristic as compared to the more flexible plastic carrier, from the carrier. Over time, the chip can actually become detached from the carrier. Also, the relatively large stress forces concentrated in the circumambient region of the chip and at the exterior terminals 1 tend to crack those portions of the upper overlay film 6 which surround the exterior terminals 1. Such cracks shorten the useful working lifetime of the card.

SUMMARY OF THE INVENTION

1. Objects of the Invention

It is an object of this invention to provide a shock-resistant integrated circuit card free of the aforementioned defects and disadvantages.

Another object of this invention is to provide an integrated circuit card which is strongly resistant to pushing, pulling, bending and twisting forces which tend to deform the card and detach the chip therefrom.

A further object of this invention is to provide a durable integrated circuit card which can withstand routine handling of the card without cracking or breaking.

2. Features of the Invention

In keeping with these objects, and others which will become apparent hereinafter, one feature of this invention resides, briefly stated, in a shock-resistant integrated circuit card comprising an elongated carrier having at least one long side and an exterior surface. An integrated circuit is mounted within the carrier, and has interior terminals located within the carrier at a marginal edge region adjacent said one long side. Exterior terminals are mounted on the carrier, and are exposed to said exterior surface. The exterior terminals are located at a remote region spaced away from the marginal edge region. A flexible circuitboard is supported by the carrier, and extends between the marginal edge region and the remote region. In accordance with this invention, the flexible board flexibly and electrically interconnects the interior and exterior terminals, and maintains an electromechanical connection therebetween, despite the application of any forces tending to deform the card.

In an advantageous construction, the carrier is flattened and has a generally rectangular configuration with two long sides, two short sides and two exterior generally planar major surfaces. The carrier has a central body on which the integrated circuit is supported, and a pair of overlay films applied over the two major surfaces.

The flexible board includes an electrically-conductive means applied, e.g., by plating, and extending between the interior and exterior terminals. Advantageously, the flexible board has an upper surface on which the exterior terminals are supported, and an opposite lower surface facing the integrated circuit. The conductive means is mounted on the lower surface of the board, and extends through holes formed through the board to the upper surface of the flexible board.

Another feature of this invention resides in providing a blocking layer overlying the integrated circuit and the flexible board, and located underneath one of the overlay films. The blocking layer is operative to prevent inspection of and tampering with the integrated circuit and the flexible board.

Yet another feature of this invention is embodied in providing a magnetic tape stripe which extends longitudinally between the two short sides of the carrier at the marginal edge region lengthwise along the carrier. The integrated circuit is preferably located underneath this magnetic stripe. Any deformation forces applied to the card will have a low magnitude at this marginal edge region and, therefore, the integrated circuit is less likely to become detached from the card.

The novel features which are considered as characteristic of the invention are set forth in particular in the appended claims. The invention itself, however, both as to its construction and its method of operation, together with additional objects and advantages thereof, best will be understood from the following description of specific embodiments when read in connection with the accompanying drawings.

DETAILED DESCRIPTION OF THE PREFERRED EMBODIMENTS

Figure 1:
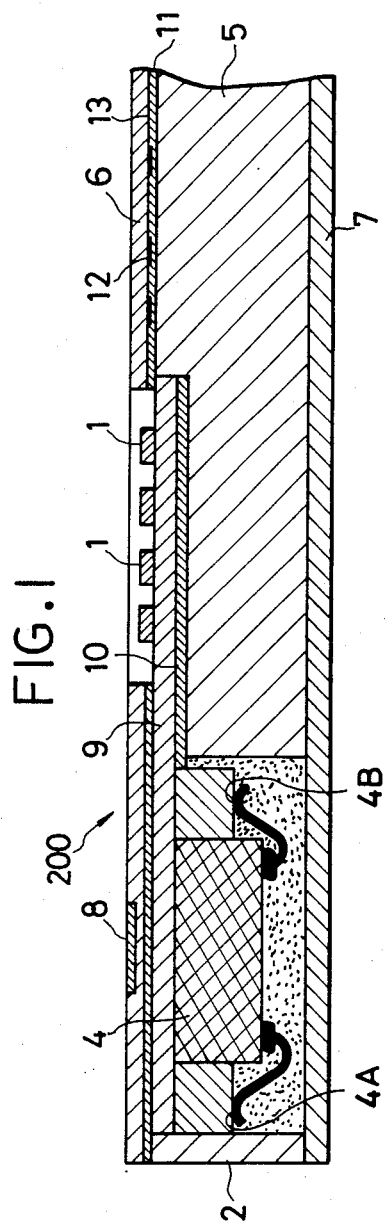
FIG. 1 is a broken-away longitudinal cross-sectional enlarged view of an integrated circuit card according to the present invention, and taken along the line I—I of FIG. 2.
Figure 2:
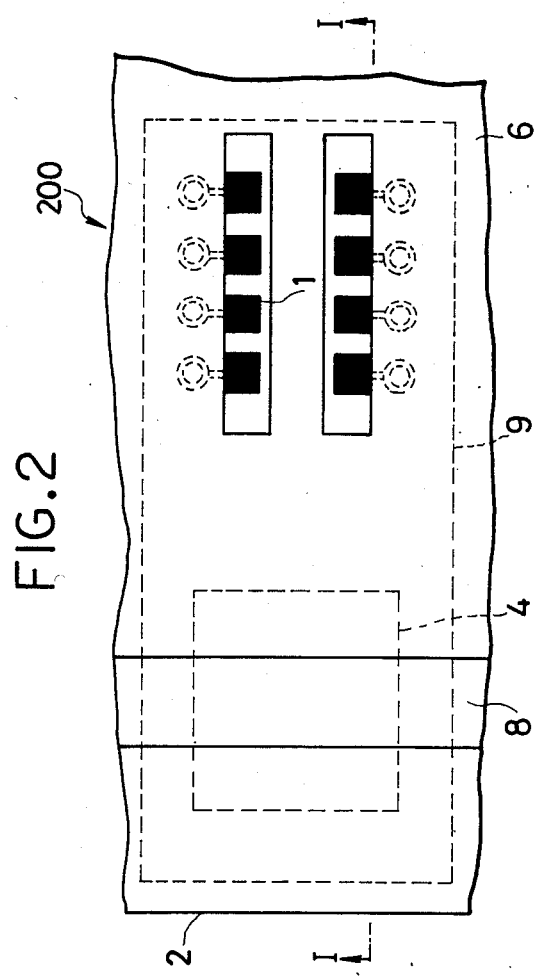
FIG. 2 is a top plan view of the integrated circuit card of FIG. 1.
Figure 3:
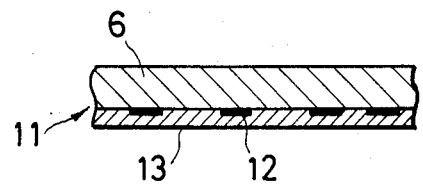
FIG. 3 is a broken-away longitudinal cross-sectional view of a detail in further enlargement of the integrated circuit card of FIG. 1.
Figure 4:
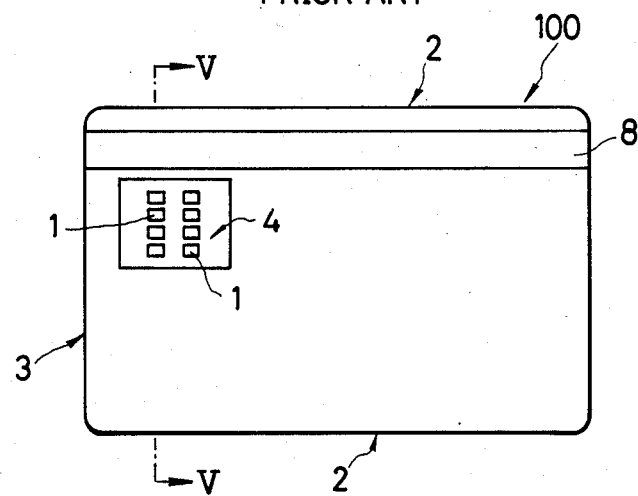
FIG. 4 is a top plan view of a conventional integrated circuit card according to the prior art.
Figure 5:
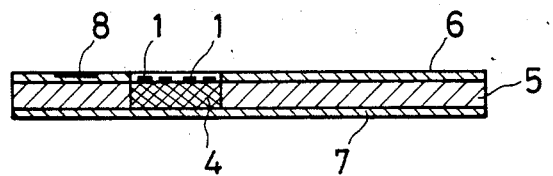
FIG. 5 is a longitudinal cross-sectional view of the prior art integrated circuit card taken along the line V—V of FIG. 4.

Referring now to the invention as illustrated in FIGS. 1-3 of the drawings, similar or corresponding components to those described above in connection with the prior art illustrated in FIGS. 4 and 5 have been designated by like reference numerals and, hence, a detailed description of such components is not believed to be necessary and will not be repeated for the sake of brevity.

A shock-resistant integrated circuit card 200 has a pair of longitudinally-extending long sides 2, a pair of transversely-extending short sides 3, a longitudinal axis of symmetry, and two opposite generally planar exterior major surfaces on which upper and lower overlay films 6, 7 are respectively applied. The card 200 includes a central carrier 5 sandwiched between the films 6, 7. A longitudinally-extending magnetic stripe 8 extends along a marginal edge region of the carrier in a direction parallel to either long side 2, and closely adjacent one of said long sides 2.

An integrated circuit module including an integrated circuit or chip 4 is mounted within the card on the carrier 5. The chip 4 has interior terminals 4A, 4B at the underside of the chip. Exterior terminals 1 are provided at, and are exposed through, an opening formed in the upper film 6 so that the exterior terminals are exposed to the exterior of the card for access purposes. As shown in FIG. 2, the exterior terminals 1 are arranged in two rows. The chip 4 is located not directly beneath the exterior terminals 1 as in the prior art, but, instead, is spaced transversely away from the exterior terminals 1 at the aforementioned marginal edge region of the card and, in a preferred embodiment, is located directly underneath the magnetic stripe 8. The deformation forces typically encountered during routine handling of the card tend to be of a lesser magnitude at the marginal edge region as compared to those forces acting at the center of the card. Thus, the placement of the chip 4 further away from the longitudinal center of the card renders the card more resistant against detachment of the chip therefrom.

In order to electrically interconnect and span the transverse distance between the exterior terminals 1 and the chip 4, a flexible circuitboard 9 is located underneath the upper overlay film 6 and above the chip 4. The flexible board 9 has an upper face on which the exterior terminals 1 are mounted, and a lower face on which electrically-conductive means 10, e.g. a set of leads, are mounted, for example, by being plated on the board 9. Each lead 10 is in electrical communication with the interior terminals 4A, 4B, and extends therefrom along the lower face of the flexible board 9 in a transverse direction to a position underneath the exterior terminals 1 and, thereupon, each lead 10 extends upwardly through through-holes (see FIG. 2) extending through the board 9 to the exterior terminals 1 and making electrical contact therewith. The provision of the leads 10 on the lower face of the flexible board 9 assists in preventing inspection of and tampering with the leads 10. The flexible board 9 may be constituted, advantageously, of a glass epoxy resin or a polyamide resin, and has a heat deformation and bonding characteristic similar to that of the carrier 5 which is advantageously made of a synthetic plastic material. The flexible board 9 is made as an independent discrete element, and may be bonded by heat to the chip 4, or may be adhered thereto with the aid of an adhesive. Alternatively, the board 9 and the chip 4 may be integrally made in a one-piece construction of the same material.

As best shown in FIG. 3, a blocking layer 11 is formed on the lower surface of the upper overlay film 6, and comprises a predetermined print pattern 12 printed on the lower surface of the overlay film 6, and a white close printing layer 13 covers the print pattern 12. A screen ink of a vinyl chloride type is used for the white close printing layer 13. The blocking layer 11 at least overlies the chip 4 and the flexible board 9, thereby concealing the chip, the flexible board, the positions of the through-holes in the flexible board, and the leads 10 on the underside of the flexible board 9, thereby preventing inspection of and tampering with these parts.

When an external force is applied to the card 200 to cause its deformation, the stress applied to the relatively stiff chip is much less than compared to prior art cards when the chip was located closer to the center of the card. The flexibility of the flexible board 9 ensures that the large stress at the center of the card is not transmitted to the chip. Also, no large stresses are concentrated in the corners of the opening formed in the overlay film 6, thereby preventing cracking of the film 6 in these regions. To further minimize concentration of forces in these corner regions, the end of the flexible board 9 near the exterior terminals 1 may be rounded. The same effect can be obtained by rounding the corners of the chip itself. The stress concentration may be yet further minimized by omitting the part of the flexible board 9 which is located between the two rows of the exterior terminals 1.

It will be understood that each of the elements described above, or two or more together, also may find a useful application in other types of constructions differing from the types described above.

While the invention has been illustrated and described as embodied in a shock-resistant integrated circuit card, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims:

1. A shock-resistant integrated circuit card, comprising:
   (a) an elongated carrier having at least one long side and an exterior surface;
   (b) an integrated circuit mounted within the carrier and having interior terminals located within the carrier at a marginal edge region adjacent said one long side;
   (c) exterior terminals mounted on the carrier and exposed to said exterior surface, said exterior terminals being located at a remote region spaced apart from said marginal edge region; and
   (d) a flexible circuitboard supported by the carrier and extending between said marginal edge region and said remote region, said flexible board flexibly and electrically interconnecting the interior and exterior terminals to maintain an electromechanical connection therebetween despite the application of forces tending to deform the card.

2. The card as defined in claim 1, wherein the carrier has a generally rectangular, flattened configuration having two long sides, two short sides, and two exterior, generally planar, major surfaces; and wherein the carrier has a central body on which the integrated circuit is supported, and a pair of overlay films applied over the major surfaces.

3. The card as defined in claim 2, wherein the flexible board includes an electrically-conductive means extending between the interior and exterior terminals.

4. The card as defined in claim 3, wherein the flexible board has an upper surface on which the exterior terminals are supported, and an opposite lower surface facing the integrated circuit; and wherein the conductive means is mounted on the lower surface of the flexible board and extends through the same to the upper surface of the flexible board.

5. The card as defined in claim 2; and further comprising a blocking layer overlying the integrated circuit and the flexible board, and located underneath one of the overlay films to prevent inspection of and tampering with the integrated circuit and the flexible board.

6. The card as defined in claim 2; and further comprising a magnetic tape stripe extending between the two short sides of the carrier at said marginal edge region in a longitudinal direction generally parallel to said one long side, said integrated circuit being located underneath the magnetic stripe.

7. The card as defined in claim 1, wherein the carrier is elongated along a longitudinal direction and has a longitudinal axis of symmetry; and wherein said remote region is spaced transversely away from said marginal edge region between said one long side and said axis of symmetry.

8. A shock-resistant integrated circuit card, comprising:
   (a) a generally rectangular, flattened carrier having a longitudinal axis of symmetry, two long sides, two short sides, and two opposite generally planar exterior surfaces, said carrier including a central body, and a pair of overlay films applied over the exterior surfaces of the carrier;
   (b) a magnetic tape stripe extending longitudinally between the two short sides of the carrier along a marginal edge region adjacent and parallel to one of the long sides of the carrier;
   (c) an integrated circuit mounted on the body underneath the magnetic stripe and having interior terminals located within the carrier at the marginal edge region;
   (d) exterior terminals mounted on the carrier and exposed to one of the exterior surfaces through an opening in one of the overlay films, said exterior terminals being located at a remote region transversely spaced apart from the marginal edge region between the one long side and the axis of symmetry;
   (e) a flexible circuitboard located underneath said one overlay film and extending between the marginal edge region and the remote region, said flexible board having an upper surface on which the exterior terminals are supported, an opposite lower surface facing the integrated circuit, and an electrically-conductive means on and extending along the lower surface from the interior terminals through the board and to the exterior terminals on the upper surface of the board, said board flexibly and electrically interconnecting the interior and exterior terminals to maintain an electromechanical connection therebetween despite the application of forces tending to deform the card; and
   (f) a blocking layer overlying the integrated circuit and the flexible board, and located underneath said one overlay film to prevent inspection of and tampering with the integrated circuit and the flexible board.

* * * * *